United States Patent
Kim et al.

(10) Patent No.: US 10,319,738 B2
(45) Date of Patent: Jun. 11, 2019

(54) THREE DIMENSIONAL SEMICONDUCTOR MEMORY DEVICES

(71) Applicant: SAMSUNG ELECTRONICS CO., LTD., Suwon-si, Gyeonggi-do (KR)

(72) Inventors: Chang-Bum Kim, Seoul (KR); Sunghoon Kim, Seongnam-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/844,188

(22) Filed: Dec. 15, 2017

(65) Prior Publication Data

US 2018/0294277 A1 Oct. 11, 2018

(30) Foreign Application Priority Data

Apr. 5, 2017 (KR) .................. 10-2017-0044144

(51) Int. Cl.

| | |
|---|---|
| *G11C 16/04* | (2006.01) |
| *G11C 16/08* | (2006.01) |
| *G11C 5/06* | (2006.01) |
| *H01L 27/11582* | (2017.01) |
| *G11C 16/10* | (2006.01) |
| *H01L 27/1157* | (2017.01) |
| *H01L 27/11575* | (2017.01) |
| *H01L 27/02* | (2006.01) |
| *G11C 8/08* | (2006.01) |
| *G11C 8/14* | (2006.01) |
| G11C 8/10 | (2006.01) |
| G11C 5/02 | (2006.01) |

(52) U.S. Cl.
CPC .......... *H01L 27/11582* (2013.01); *G11C 8/08* (2013.01); *G11C 8/14* (2013.01); *G11C 16/0483* (2013.01); *G11C 16/08* (2013.01); *G11C 16/107* (2013.01); *H01L 27/0207* (2013.01); *H01L 27/1157* (2013.01); *H01L 27/11575* (2013.01); G11C 5/025 (2013.01); G11C 8/10 (2013.01)

(58) Field of Classification Search
CPC .. G11C 5/025; G11C 8/10; G11C 8/08; G11C 8/14; G11C 16/0483; G11C 16/08; G11C 16/107; H01L 27/11582; H01L 27/0207; H01L 27/1157; H01L 27/11575
USPC ..................................... 365/185.17
See application file for complete search history.

(56) References Cited

U.S. PATENT DOCUMENTS

| | | |
|---|---|---|
| 8,027,199 B2 | 9/2011 | Hwang et al. |
| 9,030,869 B2 | 5/2015 | Yun et al. |
| 9,142,297 B2 | 9/2015 | Kim et al. |
| 9,349,455 B2 | 5/2016 | Kang et al. |
| 9,437,300 B2 | 9/2016 | Kamata et al. |

(Continued)

*Primary Examiner* — Ly D Pham
(74) *Attorney, Agent, or Firm* — Volentine, Whitt & Francos, PLLC

(57) ABSTRACT

A three-dimensional semiconductor memory device includes a cell string vertically extending from a top surface of a substrate and having first and second cell transistors, first and second word lines connected to gate electrodes of the first and second cell transistors respectively, a first pass transistor connecting the first word line to a row decoder, and a second pass transistor connecting the second word line to the row decoder. The first pass transistor includes a plurality of first sub-transistors connected in parallel between the first word line and the row decoder.

15 Claims, 21 Drawing Sheets

(56) References Cited

U.S. PATENT DOCUMENTS

| | | | |
|---|---|---|---|
| 2015/0179264 A1* | 6/2015 | Kim | G11C 16/0483 |
| | | | 365/185.11 |
| 2016/0019946 A1 | 1/2016 | Lin et al. | |
| 2016/0086669 A1* | 3/2016 | Kim | G11C 5/063 |
| | | | 365/185.11 |
| 2016/0254054 A1 | 9/2016 | Kang et al. | |

* cited by examiner

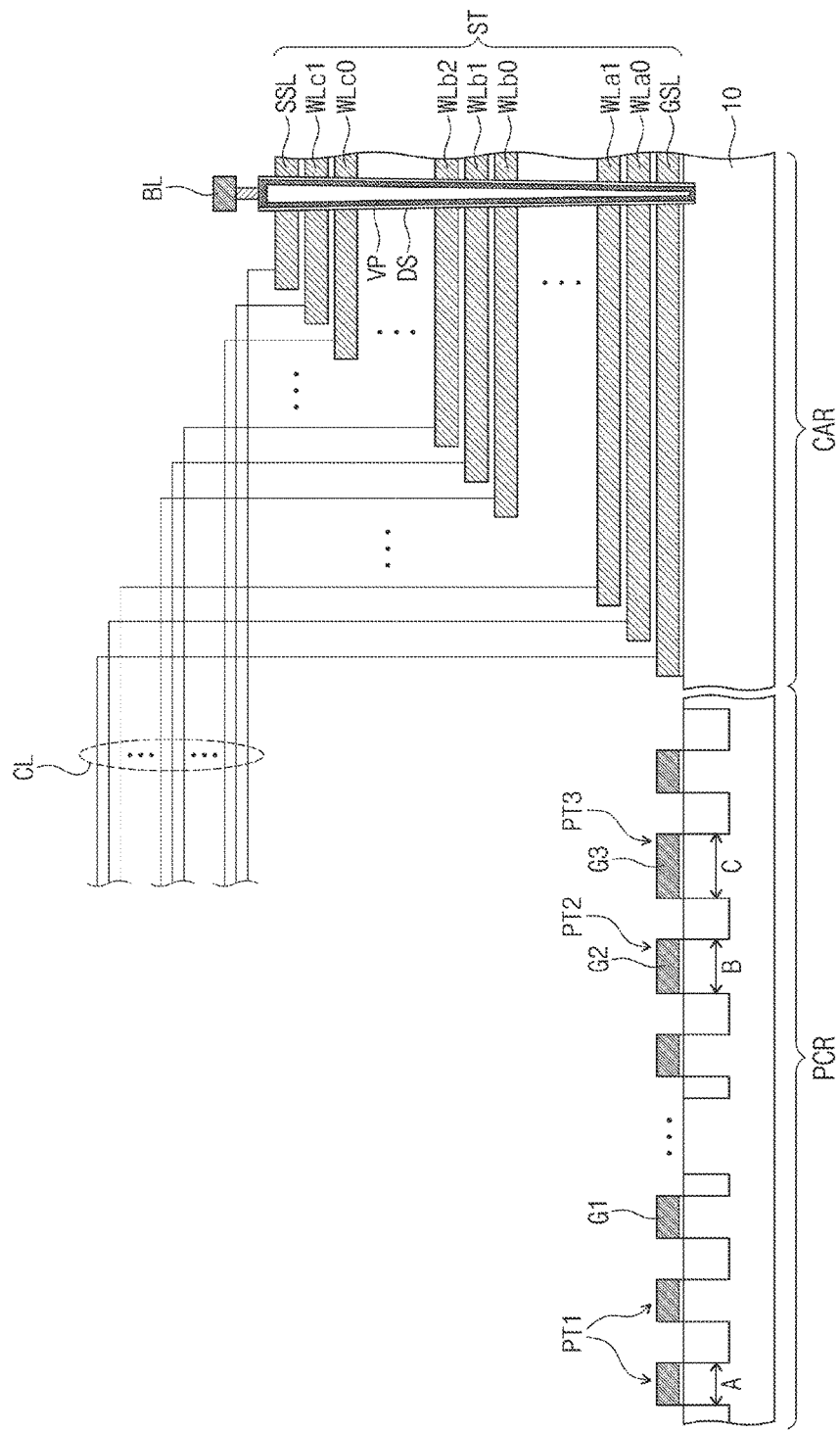

FIG. 18

| | GSL | WLa0 | WLa1 | ... | WLb0 | WLb1 | ... | WLc0 | WLc1 | SSL |
|---|---|---|---|---|---|---|---|---|---|---|
| EX1 | PT1 | PT1 | PT1 | | PT1 | PT1 | | PT1 | PT2 | PT1 |
| EX2 | PT1 | PT1 | PT1 | | PT1 | PT1 | | PT2 | PT1 | PT1 |
| EX3 | PT1 | PT1 | PT1 | | PT1 | PT1 | | PT2 | PT2 | PT1 |
| EX4 | PT1 | PT1 | PT1 | ... | PT1 | PT1 | ... | PT2 | PT3 | PT1 |
| EX5 | PT1 | PT1 | PT1 | | PT1 | PT1 | | PT3 | PT2 | PT1 |
| EX6 | PT1 | PT1 | PT1 | | PT1 | PT2 | | PT3 | PT3 | PT1 |
| EX7 | PT2 | PT1 | PT1 | | PT1 | PT2 | | PT2 | PT2 | PT2 |
| EX8 | PT1 | PT1 | PT1 | | PT2 | PT1 | | PT1 | PT2 | PT2 |

THREE DIMENSIONAL SEMICONDUCTOR MEMORY DEVICES

CROSS-REFERENCE TO RELATED APPLICATIONS

This U.S. nonprovisional patent application claims priority under 35 U.S.C § 119 of Korean Patent Application No. 10-2017-0044144 filed on Apr. 5, 2017, in the Korean Intellectual Property Office, the disclosure of which is hereby incorporated by reference in its entirety.

BACKGROUND

The present disclosure relates to a semiconductor memory device, and more particularly, to a three-dimensional semiconductor memory device having enhanced electrical characteristics.

Semiconductor devices have been highly integrated for satisfying high performance and low manufacture costs which are required by users. Since integration of the semiconductor devices is an important factor in determining product price, high integration is increasingly demanded in particular. Therefore, there have been proposed three-dimensional semiconductor memory devices having three-dimensionally arranged memory cells.

SUMMARY

Embodiments of the present disclosure provide a three-dimensional semiconductor memory device having enhanced reliability and electrical characteristics.

An object of the present disclosure is not limited to the above-mentioned one, other objects which have not been mentioned above will be clearly understood to those skilled in the art from the following description.

According to exemplary embodiments of the present disclosure, a three-dimensional semiconductor memory device may include a cell string vertically extending from a top surface of a substrate and including first and second cell transistors. First and second word lines are connected to gate electrodes of the first and second cell transistors, respectively. A first pass transistor connects the first word line to a row decoder, and a second pass transistor connects the second word line to the row decoder. The first pass transistor may include a plurality of first sub-transistors connected in parallel between the first word line and the row decoder.

According to exemplary embodiments of the present disclosure, a three-dimensional semiconductor memory device may include a substrate including a peripheral circuit region and a cell array region. An electrode structure includes word lines vertically stacked on the substrate of the cell array region. The word lines include a lower word line positioned from a top surface of the substrate at a first distance and an upper word line positioned from the top surface of the substrate at a second distance greater than the first distance. A first pass transistor is disposed on the substrate of the peripheral circuit region and connects the row decoder to the lower word line. A second pass transistor is disposed on the substrate of the peripheral circuit region and connects the row decoder to the upper word line. The first pass transistor may include m first sub-transistors connected to the lower word line, and the second pass transistor may include n second sub-transistors connected to the upper word line, where n and m are natural numbers.

According to exemplary embodiments of the present disclosure, a manufacturing method for a three-dimensional semiconductor memory device includes: forming a memory cell string vertically extending from a top surface of a substrate and including first and second cell transistors; forming first and second address lines connected to gate electrodes of the first and second cell transistors, respectively; forming a first pass transistor device, having a first effective gate width, connecting the first address line to a row decoder; and forming a second pass transistor device, having a second effective gate width, connecting the second address line to the row decoder. The second effective gate width is different than the first effective gate width so as to reduce a time difference in transmitting a driving signal from the row decoder to each of the first and second address lines.

BRIEF DESCRIPTION OF THE DRAWINGS

FIG. 16 is a cross-sectional view of a three-dimensional semiconductor memory device according to exemplary embodiments of the present disclosure.

FIG. 18 is a table for explaining a connection between electrode structures and pass transistors according to exemplary embodiments of the present disclosure.

DETAILED DESCRIPTION OF EMBODIMENTS

Hereinafter, a three-dimensional semiconductor memory device according to exemplary embodiments of the present disclosure will be described in detail in conjunction with the accompanying drawings.

Figure 1:
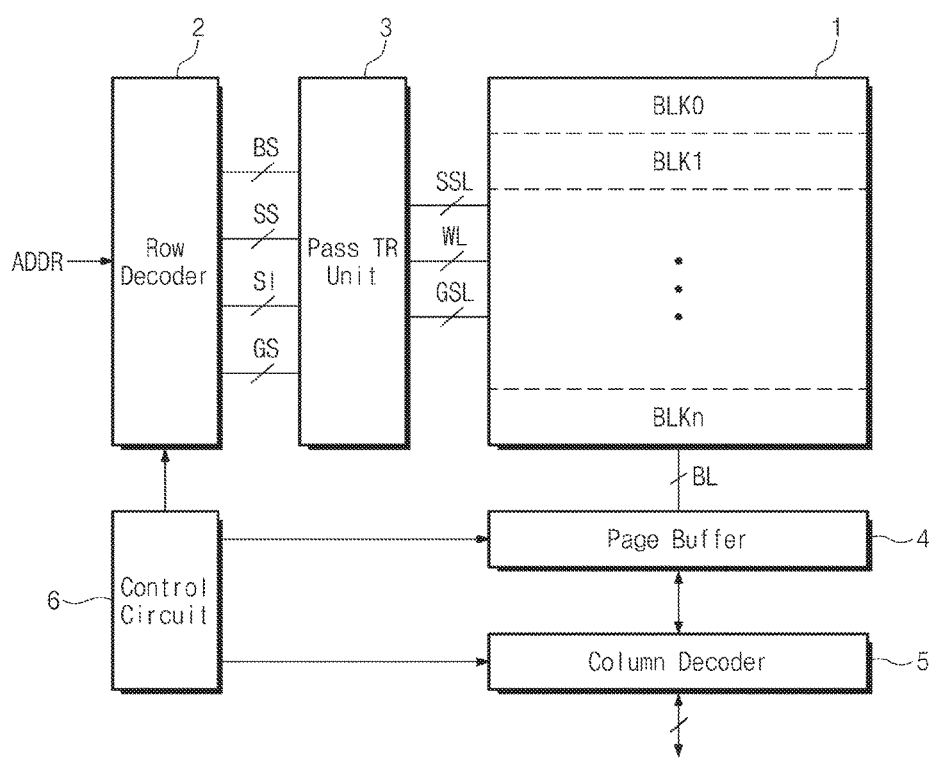
FIG. 1 is a schematic diagram for explaining a simplified configuration of a three-dimensional semiconductor memory device according to exemplary embodiments of the present disclosure.

FIG. 1 is a schematic diagram for explaining a simplified configuration of a three-dimensional semiconductor memory device according to exemplary embodiments of the present disclosure.

Referring to FIG. 1, a three-dimensional semiconductor memory device may include a memory cell array 1, a row decoder 2, a pass transistor unit 3, a page buffer 4, a column decoder 5, and a control circuit 6.

The memory cell array 1 may include a plurality of memory blocks BLK0 to BLKn, and each of the memory blocks BLK0 to BLKn may include a plurality of three-dimensionally arranged memory cells and a plurality of word lines WL and bit lines BL that are electrically connected to the memory cells.

The row decoder 2 may decode an address ADDR input externally to select one of the memory blocks BLK0 to BLKn, and may then select one of the word lines WL included in the selected memory block.

The row decoder 2 may be connected in common to a plurality of memory blocks BLK0 to BLKn, and may operate such that driving signals SS, GS, and SI generated from a voltage generating circuit (not shown) may be provided to select lines GSL and SSL and the word lines WL of the memory block (or one of BLK0 to BLKn) selected by a block select signal BS.

The pass transistor unit 3 may be connected to the memory cell array 1 through the word lines WL and the select lines SSL and GSL. The pass transistor unit 3 may be controlled by the block select signal BS provided from the row decoder 2. The pass transistor unit 3 may transmit word line signals SI and select signals SS and GS to the select lines SSL and GSL and the word lines WL of the selected one of the memory blocks BLK0 to BLKn.

In some embodiments, the memory cell array 1 may include three-dimensional NAND Flash memory cells, and the word lines WL may be provided with the word line signals SI such as a program voltage, a read voltage, a pass voltage, and a verification voltage that are generated from a voltage generator (now shown). The program voltage may be relatively higher than the read voltage, the pass voltage, and the verification voltage. Accordingly, the pass transistor unit 3 may include high voltage transistors capable of withstanding high voltage.

The page buffer 4 may be connected through the bit lines BL to the memory cell array 1 and may read information stored in the memory cells. The page buffer 4 may be connected to the bit line selected by an address decoded from the column decoder 5. Depending on an operating mode, the page buffer 4 may temporarily store data to be stored in the memory cells or sense data stored in the memory cells. For example, the page buffer 4 may function as a write driver circuit in a program operating mode and as a sense amplifier circuit in a read operating mode. The page buffer 4 may receive power (e.g., voltage or current) from the control circuit 6 and provide the received power to the selected bit line.

The column decoder 5 may provide a data transmission path between the page buffer 4 and an external device (e.g., a memory controller). The column decoder 5 may decode an externally input address and select one of the bit lines. The column decoder 5 may be connected in common to a plurality of memory blocks BLK0 to BLKn, and may provide data information to the bit lines of the memory block (or one of BLK0 to BLKn) selected by the block select signal BS.

The control circuit 6 may control the overall operation of the three-dimensional semiconductor memory device. The control circuit 6 may receive control signals and external voltages, and operate in response to the received control signals. The control circuit 6 may include a voltage generator that uses an external voltage to generate voltages (e.g., a program voltage, a read voltage, an erase voltage) required for internal operations. The control circuit 6 may control read, write, and/or erase operations in response to the control signals.

Figure 2:
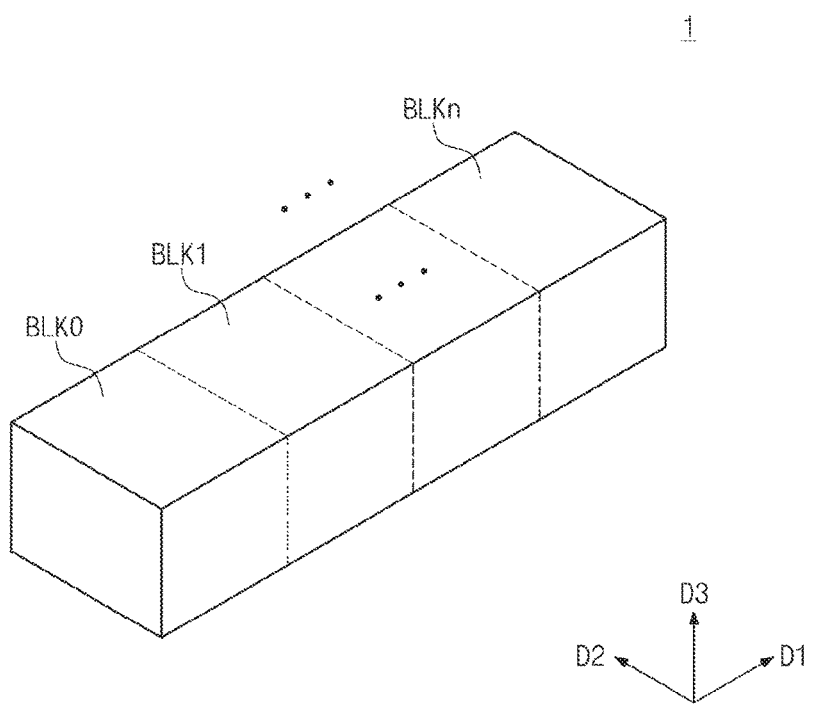
FIG. 2 is a simplified block diagram illustrating a cell array of a three-dimensional semiconductor memory device according to exemplary embodiments of the present disclosure.

FIG. 2 is a simplified block diagram illustrating a cell array of a three-dimensional semiconductor memory device according to exemplary embodiments of the present disclosure.

Referring to FIG. 2, a memory cell array 1 may include a plurality of memory blocks BLK0 to BLKn. Each of the memory blocks BLK0 to BLKn may include an electrode structure including word lines stacked along a third direction D3 on a plane elongated along first and second directions D1 and D2. The word lines of the electrode structure may combine with a plurality of vertical semiconductor pillars to constitute three-dimensionally arranged memory cells. In addition, each of the memory blocks BLK0 to BLKn may include bit lines electrically connected to the memory cells.

Figure 3:
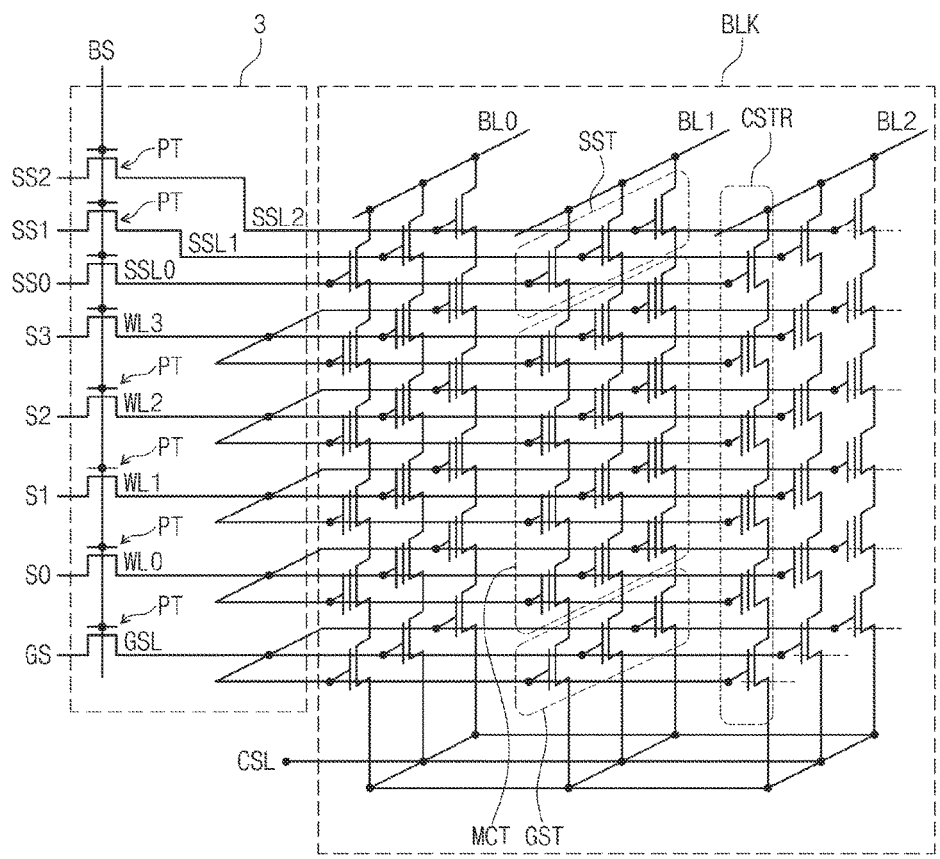
FIG. 3 is a circuit diagram illustrating a cell array and a pass transistor unit of a three-dimensional semiconductor memory device according to exemplary embodiments of the present disclosure.

FIG. 3 is a circuit diagram illustrating a cell array and a pass transistor unit of a three-dimensional semiconductor memory device according to exemplary embodiments of the present disclosure.

Referring to FIG. 3, a pass transistor unit 3 may be connected to a corresponding memory block BLK.

The memory block BLK may include a common source line CSL, a plurality of bit lines BL0 to BL2, and a plurality of cell strings CSTR disposed between the common source line CSL and the bit lines BL0 to BL2.

The bit lines BL0 to BL2 may be two-dimensionally arranged, and a plurality of cell strings CSTR may be connected in parallel to each of the bit lines BL0 to BL2. The cell strings CSTR may be connected in common to the common source line CSL. That is, a plurality of the cell strings CSTR may be disposed between a plurality of the bit lines BL0 to BL2 and one common source line CSL. For example, the common source line CSL may be provided in plural, which are two-dimensionally arranged. The common source lines CSL may be supplied with the same voltage or electrically controlled independently of each other.

Each of the cell strings CSTR may include a ground select transistor GST coupled to the common source line CSL, a string select transistor SST coupled to one of the bit lines BL0 to BL2, and a plurality of memory cell transistors MCT disposed between the ground and string select transistors GST and SST. The ground select transistor GST, the string select transistor SST, and the memory cell transistors MCT may be connected in series. The cell strings CSTR may extend along a third direction D3 on a plane elongated along first and second directions D1 and D2.

The common source line CSL may be connected in common to sources of the ground select transistors GST. A ground select line GSL, a plurality of word lines WL0 to WL3, and a plurality of string select lines SSL0 to SSL2, all of which are disposed between the common source line CSL and the bit lines BL0 to BL2, may be used as gate electrodes of the ground select transistor GST, the memory cell transistors MCT, and the string select transistor SST, respectively.

The gate electrodes of the ground select transistors GST may be connected in common to the ground select line GSL. The gate electrodes of a plurality of the memory cell transistors MCT, which are located at the same distance from the common source line CSL, may be connected in common to one of the word lines WL0 to WL3. The gate electrodes of the string select transistors SST may be connected in common to one of the string select lines SSL0 to SSL2. The string select lines SSL0 to SSL2 may extend in the first direction D1 crossing the bit lines BL0 to BL2.

In addition, each of the memory cell transistors MCT may include a data storage element. In some embodiments, the data storage element may be a charge storage layer, which is, for example, one of a trap insulation layer, a floating gate electrode, or an insulation layer including conductive nanodots.

The pass transistor unit 3 may include a plurality of pass transistors PT each connected to a corresponding one of the word lines WL0 to WL3 and the select lines SSL0 to SSL2 and GSL. The pass transistor unit 3 may transmit driving signals GS, S0 to S3, and SS0 to SS2 to the memory block BLK in response to a block select signal BS.

Figure 4:
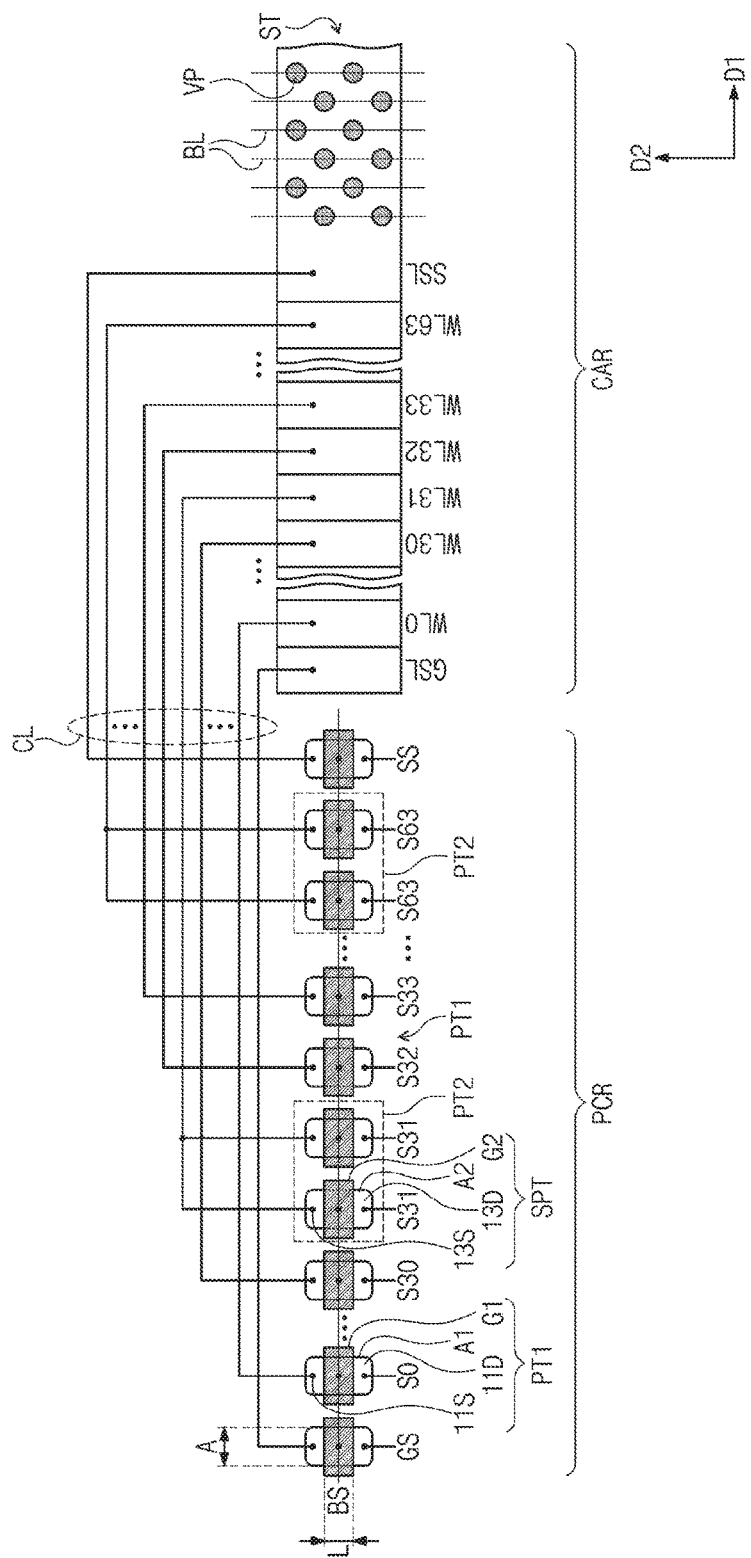
FIG. 4 is a simplified plan view of a three-dimensional semiconductor memory device according to exemplary embodiments of the present disclosure.
Figure 5:
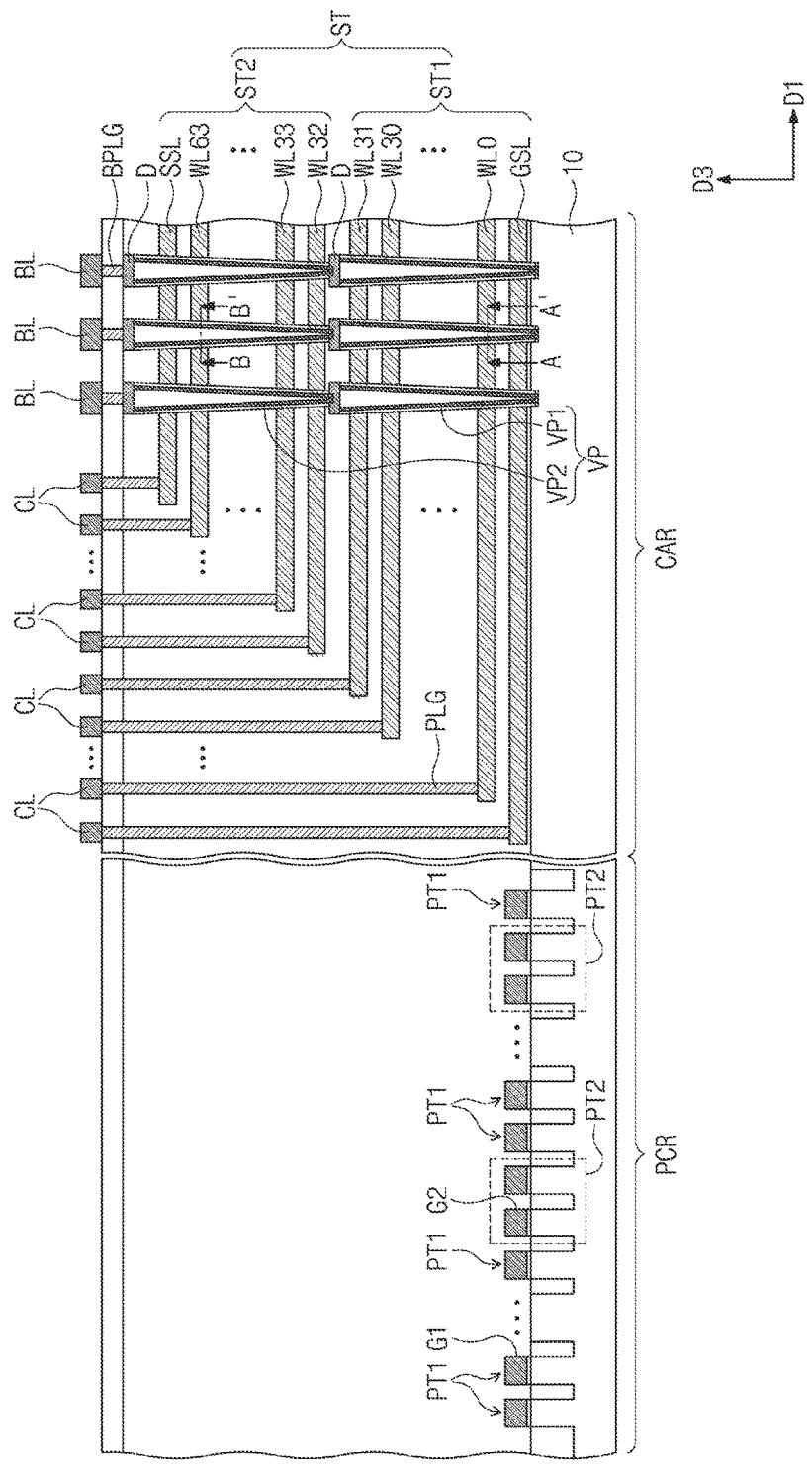
FIG. 5 is a simplified cross-sectional view taken along a first direction of FIG. 4 illustrating a three-dimensional semiconductor memory device according to exemplary embodiments of the present disclosure.
Figure 6A:
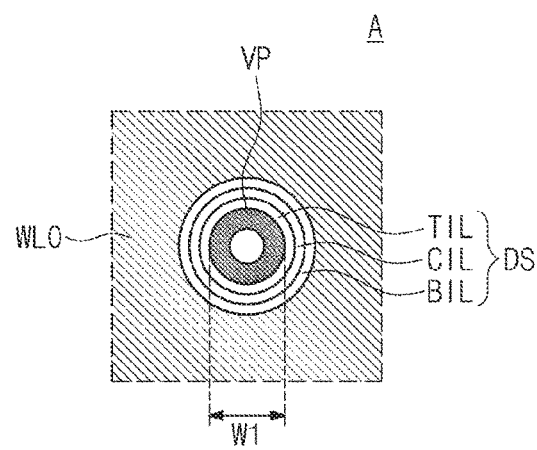
FIGS. 6A and 6B are plan views respectively taken along lines A-A' and B-B' of FIG. 5.
Figure 6B:
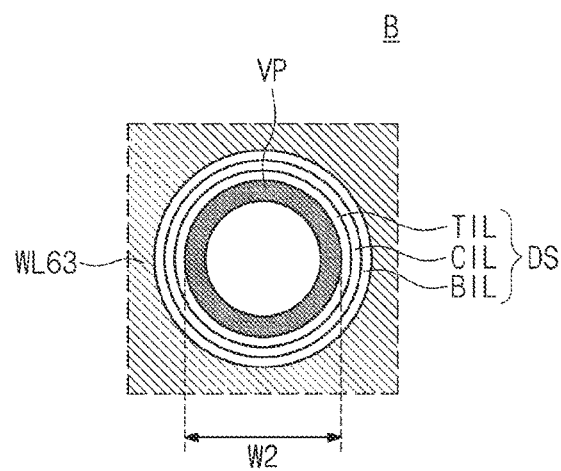

FIG. 4 is a simplified plan view of a three-dimensional semiconductor memory device according to exemplary embodiments of the present disclosure. FIG. 5 is a simplified cross-sectional view taken along a first direction of FIG. 4 illustrating a three-dimensional semiconductor memory device according to exemplary embodiments of the present disclosure. FIGS. 6A and 6B are plan views respectively taken along lines A-A' and B-B' of FIG. 5.

Referring to FIGS. 4 and 5, a substrate 10 may include a cell array region CAR and a peripheral circuit region PCR.

The substrate 10 may be one of a material (e.g., a silicon wafer) having semiconductor characteristics, an insulating material (e.g., glass), and a semiconductor or conductor covered with an insulating material. For example, the substrate 10 may be a silicon wafer having a first conductive type.

A cell array structure may be disposed on the substrate 10 of the cell array region CAR. The cell array structure may include an electrode structure ST, vertical semiconductor pillars VP penetrating the electrode structure ST, date storage layers (see DS of FIG. 6A or 6B) disposed between the electrode structure ST and the vertical semiconductor pillars VP, and bit lines BL penetrating the electrode structure ST and connected to the vertical semiconductor pillars VP.

In more detail, the electrode structure ST may extend in a first direction D1, and include a plurality of electrodes and insulation layers that are vertically and alternately stacked on the substrate 10. The electrodes of the electrode structure ST may include a string select line SSL, a ground select line GSL, and word lines WL0 to WL63 vertically stacked between the string and ground select lines SSL and GSL.

In some embodiments, in order to electrically connect pass transistors PT1 and PT2 of the peripheral circuit region PCR with the word lines WL0 to WL63 and the select lines GSL and SSL of the electrode structure ST, the electrode structure ST may have a stepwise structure descending from the cell array region CAR toward the peripheral circuit region PCR. For example, the electrode structure ST may have a height that decreases as approaching the peripheral circuit region PCR from the cell array region CAR, and the word lines WL0 to WL63 and the select lines GSL and SSL may each have a length in the first direction D1 that decreases with increasing distance from the substrate 10. In this configuration, the substrate 10 may be provided thereon with the word lines WL0 to WL63 and the select lines GSL and SSL that are vertically stacked to have exposed portions at their ends.

In some embodiments, the electrode structure ST may include a lower electrode structure ST1 and an upper electrode structure ST2. The lower electrode structure ST1 may include the ground select line GSL and lower word lines WL0 to WL31, and the upper electrode structure ST2 may include upper word lines WL32 to WL63 and the string select line SSL. A lowermost one of the upper word lines WL32 to WL63 may have a length less than that of an uppermost one of the lower word lines WL0 to WL31.

In some embodiments, the vertical semiconductor pillars VP may penetrate the electrode structure ST and be electrically connected to the substrate 10. The vertical semiconductor pillars VP may extend in the third direction D3 perpendicular to a top surface of the substrate 10. The vertical semiconductor pillars VP may include a semiconductor material (e.g., silicon), and be used as channels of the ground select transistor GST, the string select transistors SST, and the memory cell transistors MCT discussed with reference to FIG. 3.

In some embodiments, each of the vertical semiconductor pillars VP may include a lower semiconductor pillar VP1 and an upper semiconductor pillar VP2. The lower semiconductor pillar VP1 may penetrate the lower electrode structure ST1 and be connected to the substrate 10, and the upper semiconductor pillar VP2 may penetrate the upper electrode structure ST2 and be connected to the lower semiconductor pillar VP1.

Each of the lower and upper semiconductor pillars VP1 and VP2 may be formed by anisotropically etching vertically stacked layers to form holes and then depositing semiconductor layers in the holes. Since the lower and upper semiconductor pillars VP1 and VP2 are formed in the holes penetrating the vertically stacked layers, each of the lower and upper semiconductor pillars VP1 and VP2 may have a width (or a diameter) that increases as approaching its top from its bottom. Therefore, as shown in FIGS. 6A and 6B, each of the lower and upper semiconductor pillars VP1 and VP2 may have a lower width W1 and an upper width W2 greater than the lower width W1. In addition, each of the lower and upper semiconductor pillars VP1 and VP2 may have a U shape, whose internal cavity is filled with an insulating material. Alternatively, each of the lower and upper semiconductor pillars VP1 and VP2 may have a pillar shape.

Each of the lower and upper semiconductor pillars VP1 and VP2 may have a conductive pad D at its end for electrical connection to the bit line BL. For example, the conductive pad D may be composed of a semiconductor material into which an n-type impurity is doped.

In some embodiments, the data storage layers DS may be interposed between the electrode structure ST and the vertical semiconductor pillars VP. The data storage layer DS may be composed of a plurality of thin layers. For example, the data storage layer DS may include a tunnel insulation layer TIL, a charge storage layer CIL, and a blocking insulation layer BIL that constitute a layer for storing data in a NAND Flash memory device. Data stored in the data storage layer DS may be changed by Fowler-Nordheim tunneling induced by a voltage difference between the word lines WL0 to WL63 and the vertical semiconductor pillars VP including a semiconductor material.

The charge storage layer CIL may be one of an insulation layer rich in trap sites and an insulation layer including nano-particles. For example, the charge storage layer CIL may include one of a trap insulation layer, a floating gate electrode, and an insulation layer including conductive nano-dots. The tunnel insulation layer TIL may be one of high-k dielectric layers such as an aluminum oxide layer and a hafnium oxide layer. The blocking insulation layer BIL may be one of materials with a band gap narrower than that of the tunnel insulation layer TIL and wider than that of the charge storage layer CIL. The blocking insulation layer BIL may be one of high-k dielectric layers such as an aluminum oxide layer and a hafnium oxide layer.

Alternatively, the data storage layer DS may include a thin film for a phase change memory device or a variable resistance memory device.

The substrate 10 on opposite sides of the electrode structure ST may be provided therein with common source regions (not shown) serving as the common source lines CSL discussed with reference to FIG. 3. The common source regions may extend parallel to the electrode structure ST in the first direction D1. For example, the common source regions may be formed by doping the first conductive type substrate 10 with a second conductive type impurity, for example, an N-type impurity such as arsenic (As) or phosphor (P).

The bit lines BL may run across the electrode structure ST to extend in the second direction D2. The bit lines BL may be electrically connected to the vertical semiconductor pillars VP through bit line contact plugs BPLG and the conductive pads D.

The word lines WL0 to WL63 and the ground and string select lines GSL and SSL may be coupled at their ends to corresponding contact plugs PLG, and the contact plugs PLG may have different lengths from each other. The contact plugs PLG may be coupled to corresponding connection lines CL. The connection lines CL may each be connected to one of the pass transistors PT1 and PT2 provided on the substrate 10 of the peripheral circuit region PCR.

In some embodiments, a plurality of the pass transistors PT1 and PT2 may include a plurality of first pass transistors PT1 and at least one or more second pass transistors PT2, and the second pass transistor PT2 may have a size greater than that of the first pass transistor PT1.

In more detail, each of the first pass transistors PT1 may include a first gate electrode G1 extending across a first active region A1, a first source region 11S on a side of the first gate electrode G1, and a first drain region 11D on an opposite side of the first gate electrode G1. The first source regions 11S may be electrically coupled to corresponding word lines WL0, ..., WL30, WL32, WL33, ..., and the first drain regions 11D may each be coupled to one of driving signal lines S0 to S63 connected to a row decoder (see 2 of FIG. 1).

In some embodiments, the second pass transistor PT2 may include a plurality of sub-transistors SPT. Each of the sub-transistors SPT may include a second gate electrode G2 extending across a second active region A2, a second source region 13S on a side of the second gate electrode G2, and a second drain region 13D on an opposite side of the second gate electrode G2. The sub-transistors SPT may each have a first gate length L and a first gate width A, which are the same as those of the first pass transistor PT1.

A plurality of the sub-transistors SPT may be connected in parallel between a row decoder (see 2 of FIG. 1) and one of the word lines WL31 and WL63. For example, the second source regions 13S of the plurality of the sub-transistors SPT may be connected in common to at least one WL31 of the lower word lines WL0 to WL31 that is positioned at an upper portion of the lower electrode structure ST1. In addition, the second source regions 13S of the plurality of the sub-transistors SPT may be connected in common to at least one WL63 of the upper word lines WL32 to WL63 that is positioned at an upper portion of the upper electrode structure ST2. The second drain regions 13D may each be coupled to one of driving signal lines S0 to S63 connected to a row decoder (see 2 of FIG. 1). In some embodiments, since the second pass transistor PT2 is composed of a plurality of the sub-transistors SPT, the second pass transistor PT2 may have an effective gate width greater than that of the first pass transistor PT1. The effective gate width may be a sum of gate widths of the sub-transistors.

In some embodiments, the second pass transistor PT2 includes two sub-transistors SPT, but the present disclosure is not limited thereto. The number of the sub-transistors SPT may be variously changed based on a height (or a distance from the substrate 10) of the word line connected to the second pass transistor PT2.

In some embodiments, the first pass transistors PT1 may be connected to the ground and string select lines GSL and SSL and one or more of the word lines WL0 to WL63 of the electrode structure ST, and the second pass transistors PT2 may be connected to others of the word lines WL0 to WL63.

For example, the first pass transistors PT1 may be connected to at least one or more lower word lines WL0 adjacent to lower portions of the lower semiconductor pillars VP1, respectively. The second pass transistors PT2 may be connected to at least one or more lower word lines WL31, WL32 ... adjacent to upper portions of the lower semiconductor pillars VP1. In other words, the first pass transistors PT1 may be connected through the contact plugs PLG and the connection lines CL to the lower word line WL0 positioned at a first distance from the top surface of the substrate 10. The second pass transistors PT2 may be connected through the contact plugs PLG and the connection lines CL to the lower word line WL31 positioned at a second distance, greater than the first distance, from the top surface of the substrate 10.

Likewise, the first pass transistors PT1 may be connected to the lower word lines WL32, WL33, ... adjacent to lower portions of the upper semiconductor pillars VP2, respectively. The second pass transistors PT2 may be connected to at least one or more lower word lines WL63 adjacent to upper portions of the lower semiconductor pillar VP1.

The first pass transistors PT1 may be connected through the contact plugs PLG and the connection lines CL to the ground select line GSL of the lower electrode structure ST1 and the string select line SSL of the upper electrode structure ST2. Alternatively, the first pass transistor PT1 may be connected to the ground select line GSL of the lower electrode structure ST1, and the second pass transistor PT2 may be connected to the ground select line GSL of the upper electrode structure ST2.

A block select line may be connected in common to the first and second gate electrodes G1 and G2 respectively of the first and second pass transistors PT1 and PT2. Accordingly, the first and second pass transistors PT1 and PT2 connected to a single electrode structure ST may be controlled by a block select signal BS provided to the block select line.

According to exemplary embodiments, in each of the lower and upper electrode structures ST1 and ST2, since the second pass transistors PT2 are connected to the word lines each on which a relatively heavy burden is loaded and the first pass transistors PT1 are connected to the word lines each on which a relatively light burden is loaded, it may be possible to reduce a time difference in transmitting driving signals between the lower word lines WL0 to WL31 and the upper word lines WL32 to WL63.

Figure 7:
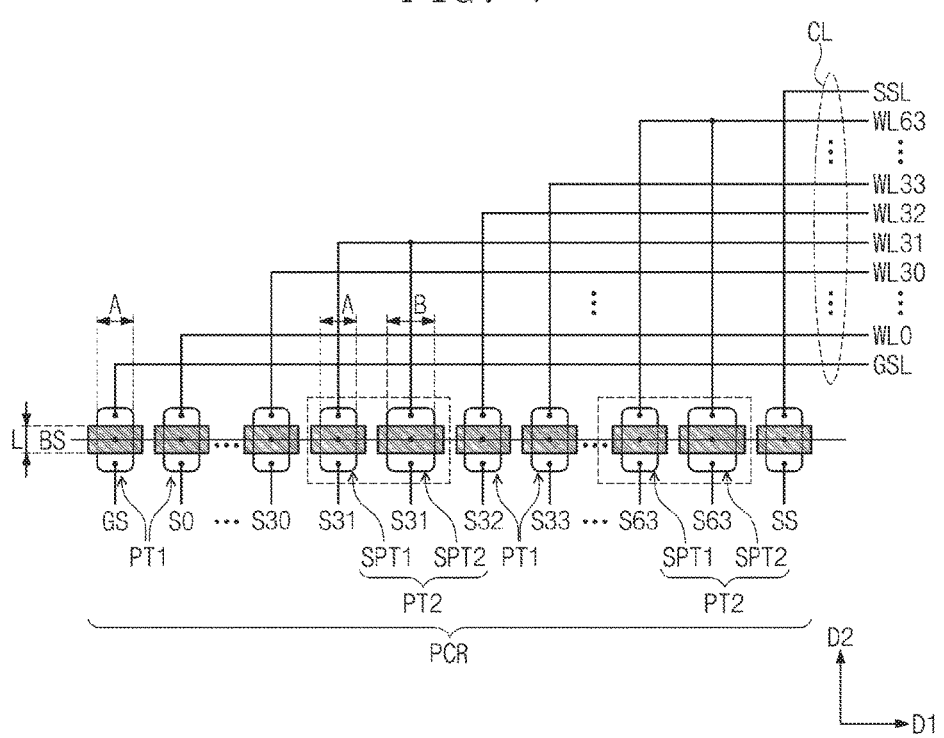
FIG. 7 is a simplified plan view for explaining a three-dimensional semiconductor memory device according to exemplary embodiments of the present disclosure.

FIG. 7 is a simplified plan view for explaining a three-dimensional semiconductor memory device according to exemplary embodiments of the present disclosure. For brevity of the description, omission will be made in explaining technical features the same as those of the three-dimensional semiconductor device discussed with reference to FIGS. 4 and 5.

Referring to FIG. 7, a plurality of sub-transistors SPT1 and SPT2 may be included in each of second pass transistors PT2 connected to word lines WL31 and WL63 positioned at upper portions of lower and upper electrode structures (see ST1 and ST2 of FIG. 5). At least one of the sub-transistors SPT1 and SPT2 may have a gate length and a gate width, at least one of which is different from that of a first pass transistor PT1.

For example, the second pass transistor PT2 may include two sub-transistors SPT1 and SPT2, and one sub-transistor SPT1 of the sub-transistors SPT1 and SPT2 may have the same first gate length L and the same first gate width A as those of the first pass transistor PT1. The other sub-transistor SPT2 of the sub-transistors SPT1 and SPT2 may have the same first gate length L as that of the first pass transistor PT1 and a second gate width B greater than the first gate width A of the first pass transistor PT1.

Figure 8:
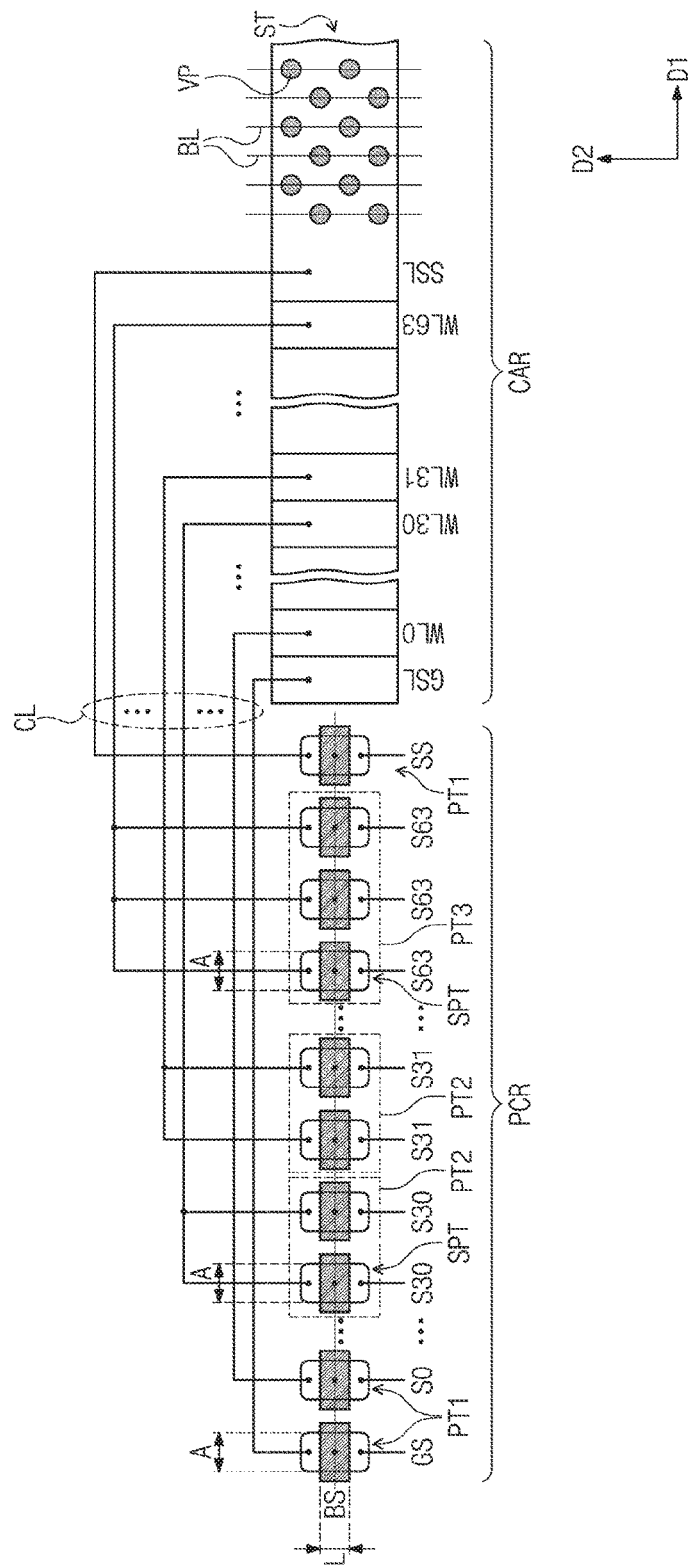
FIG. 8 is a simplified plan view of a three-dimensional semiconductor memory device according to exemplary embodiments of the present disclosure.
Figure 9:
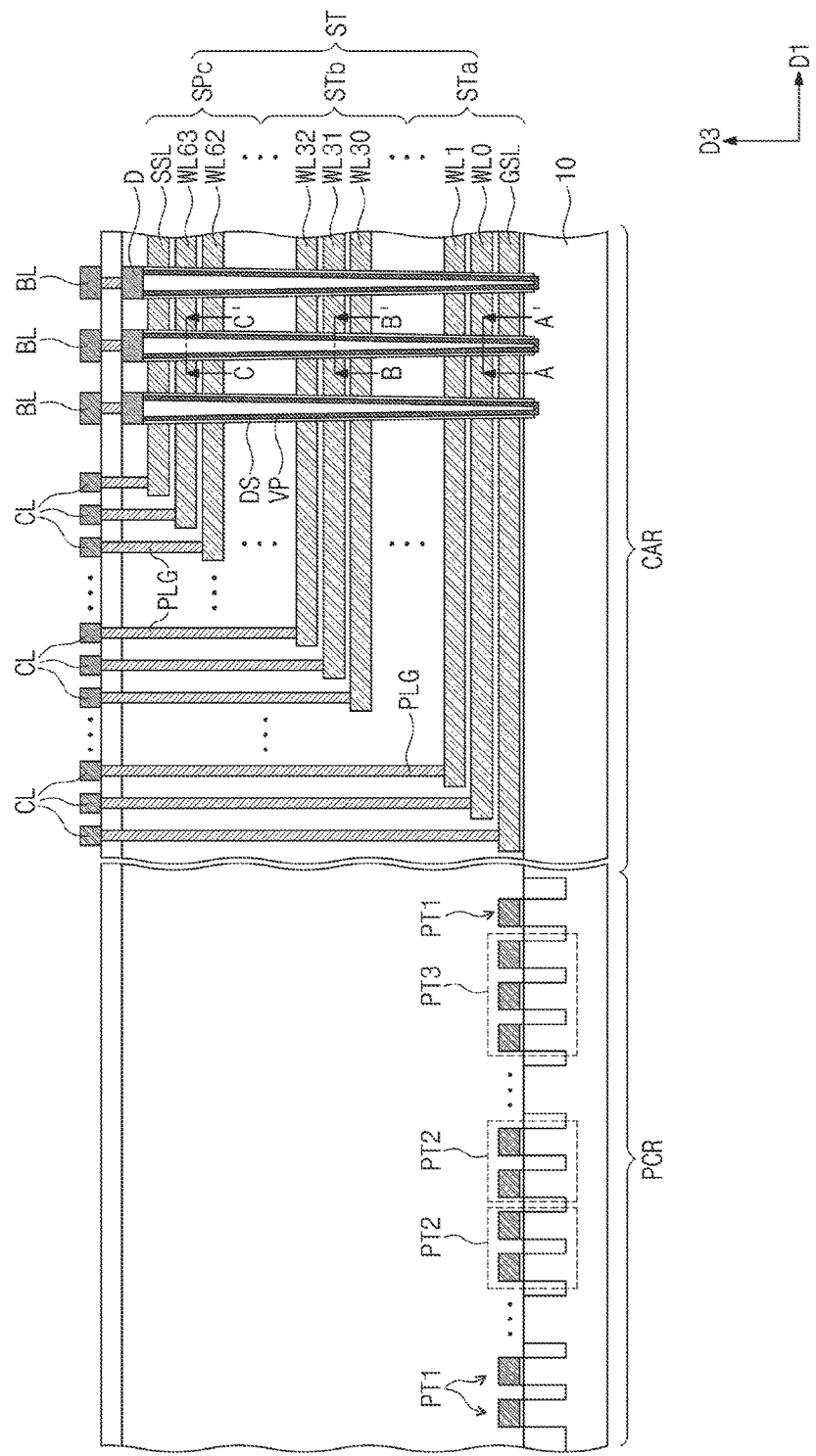
FIG. 9 is a simplified cross-sectional view taken along a first direction of FIG. 8 illustrating a three-dimensional semiconductor memory device according to exemplary embodiments of the present disclosure.
Figure 10A:
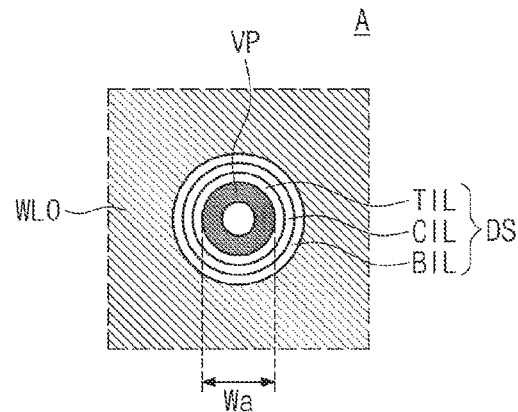
FIGS. 10A, 10B, and 10C are plan views respectively taken along lines A-A', B-B', and C-C' of FIG. 9.
Figure 10B:
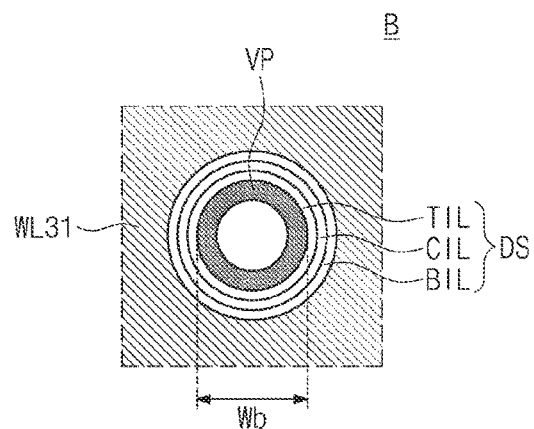
Figure 10C:
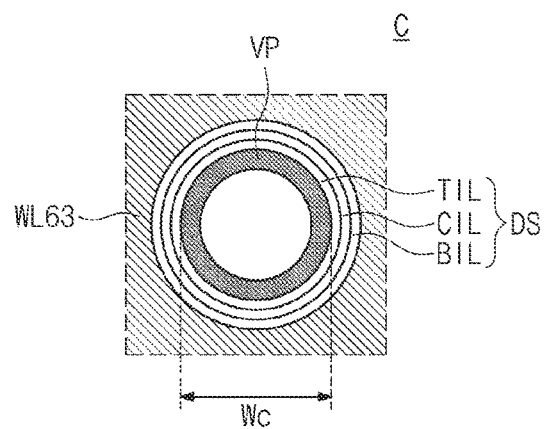

FIG. 8 is a simplified plan view of a three-dimensional semiconductor memory device according to exemplary embodiments of the present disclosure. FIG. 9 is a simplified cross-sectional view taken along a first direction of FIG. 8 illustrating a three-dimensional semiconductor memory device according to exemplary embodiments of the present disclosure. FIGS. 10A, 10B, and 10C are plan views respectively taken along lines A-A', B-B', and C-C' of FIG. 9. For brevity of the description, omission will be made in explaining technical features the same as those of the three-dimensional semiconductor device discussed with reference to FIGS. 4 and 5.

Referring to FIGS. 8 and 9, an electrode structure ST may include: a lower portion STa including lower word lines WL0, WL1, . . . ; a middle portion STb including middle word lines . . . , WL30, WL31, WL32, . . . ; and an upper portion STc including upper word lines . . . , WL62, and WL63. The electrode structure ST may have a ground select line GSL at its lowermost layer and a string select line SSL at its uppermost layer.

Vertical semiconductor pillars VP may penetrate the electrode structure ST and be electrically connected to a substrate 10. Each of the vertical semiconductor pillars VP may have a width that increases as approaching its top from its bottom. Referring to FIGS. 10A, 10B, and 10C, each of the vertical semiconductor pillars VP may have a first width Wa at its first portion adjacent to one of the lower word lines WL0, WL1, . . . ; a second width Wb, greater than the first width Wa, at its second portion adjacent to one of the middle word lines . . . , WL30, WL31, WL32, . . . ; and a third width Wc, greater than the second width Wb, at its third portion adjacent to one of the upper word lines . . . , WL62, and WL63. In other words, the middle word lines . . . , WL30, WL31, WL32, . . . may be imposed with a heavy load compared with the lower word lines WL0, WL1, . . . , and the upper word lines . . . , WL62, and WL63 may be imposed with a heavy load compared with the middle word lines . . . , WL30, WL31, WL32, . . . .

The lower word lines WL0, WL1, . . . may be connected through contact plugs PLG and connection lines CL to corresponding first pass transistors PT1, and the middle word lines . . . , WL30, WL31, WL32, . . . may be connected through contact plugs PLG and connection lines CL to corresponding second pass transistors PT2. The upper word lines . . . , WL62, and WL63 may be connected through contact plugs PLG and connection lines CL to corresponding third pass transistors PT3. In some embodiments, the first to third pass transistors PT1, PT2, and PT3 may have different sizes from each other.

In some embodiments, each of the second and third pass transistors PT2 and PT3 may include a plurality of sub-transistors SPT. Each of the sub-transistors SPT constituting one of the second and third pass transistors PT2 and PT3 may have the same size (i.e., the same gate length L and the same gate width A) as that of the first pass transistor PT1. The number of the sub-transistors SPT constituting the second pass transistor PT2 may be less than that of the sub-transistors SPT constituting the third pass transistor PT3. For example, the second pass transistor PT2 may include two sub-transistors SPT, and the third pass transistor PT3 may include three sub-transistors SPT.

The ground and string select lines GSL and SSL may each be connected to the first pass transistor PT1. Alternatively, the ground and string select lines GSL and SSL may each be connected to one of the first, second, and third pass transistors PT1, PT2, and PT3.

Figure 11:
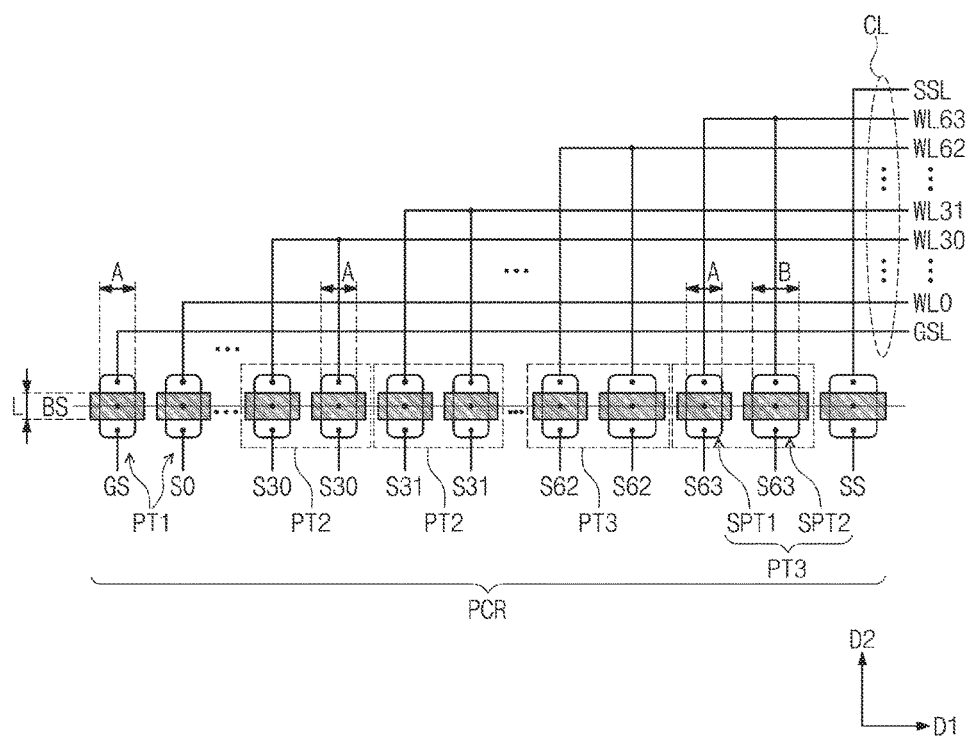
FIGS. 11 to 13 are simplified plan views for explaining a three-dimensional semiconductor memory device according to exemplary embodiments of the present disclosure.
Figure 12:
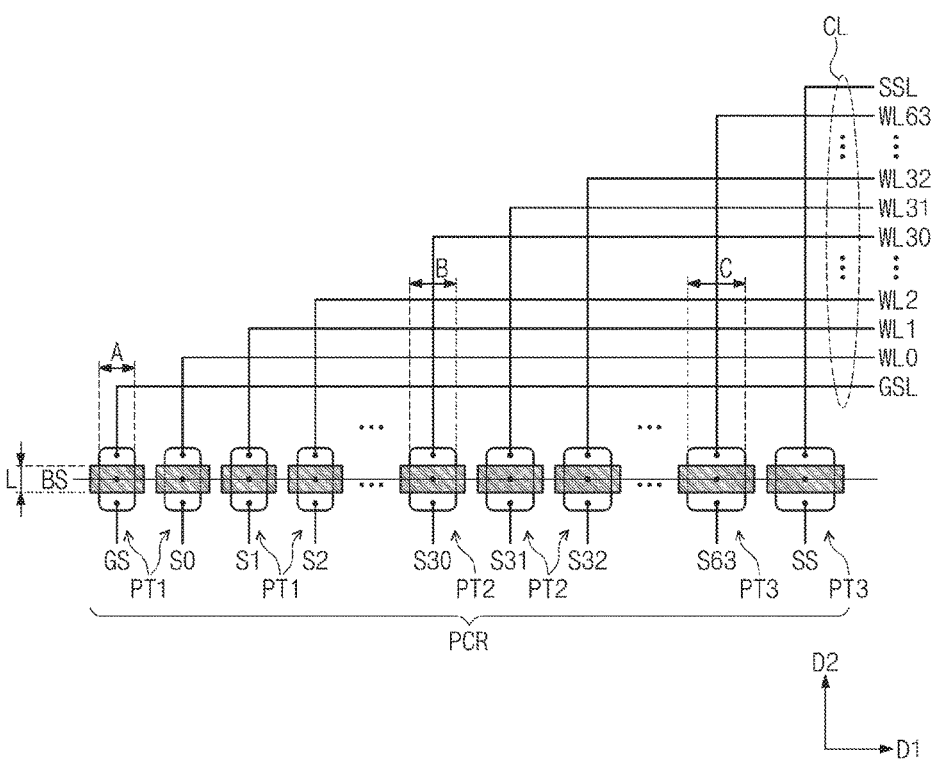
Figure 13:
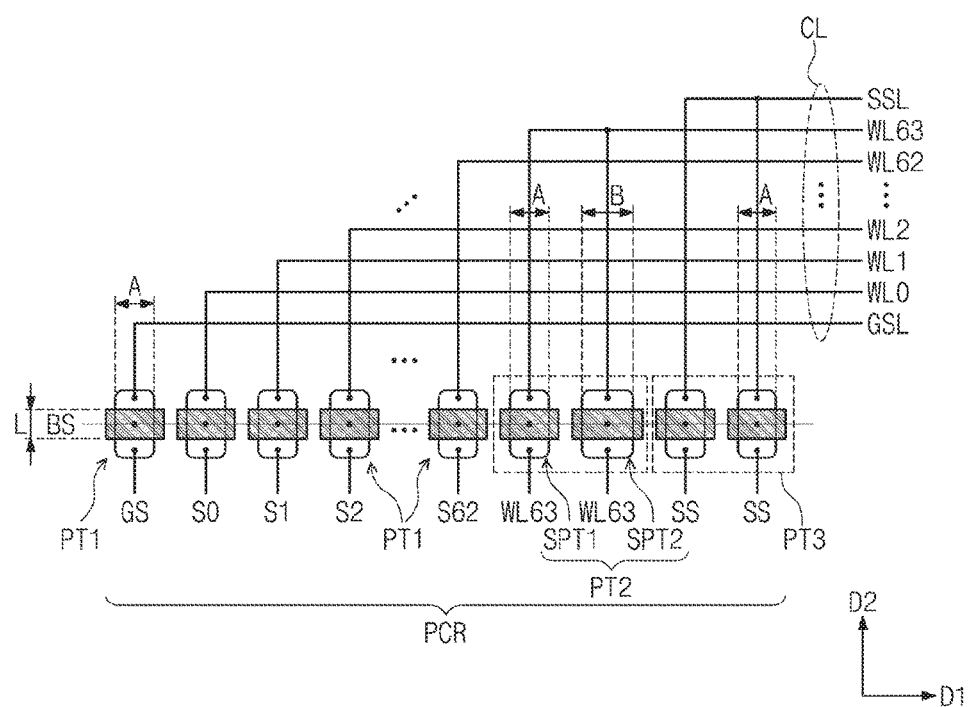

FIGS. 11, 12, and 13 are simplified plan views for explaining a three-dimensional semiconductor memory device according to exemplary embodiments of the present disclosure. For brevity of the description, omission will be made in explaining technical features the same as those of the three-dimensional semiconductor device discussed with reference to FIGS. 8 and 9.

According to an embodiment illustrated in FIG. 11, a second pass transistor PT2 connected to each of middle word lines . . . , WL30, WL31, . . . may include sub-transistors SPT having substantially the same size. A third pass transistor PT3 connected to each of upper word lines . . . , WL62, and WL63 may include a plurality of sub-transistors SPT, whose sizes may be different from each other.

For example, the third pass transistor PT3 may include first and second sub-transistors SPT1 and SPT2 that are connected in parallel between a row decoder (see 2 of FIG. 1) and one of the upper word lines . . . , WL62, and WL63. The first and second sub-transistors SPT1 and SPT2 may have substantially the same gate length L, while the first sub-transistor SPT1 may have a first gate width A and the second sub-transistor SPT2 may have a second gate width B greater than the first gate width A.

According to an embodiment illustrated in FIG. 12, each of lower word lines WL0, WL1, WL2, . . . may be connected to a source region of a first pass transistor PT1, and each of middle word lines . . . , WL30, WL31, WL32, . . . may be connected to a source region of a second pass transistor PT2. Each of upper word lines . . . , WL62, and WL63 may be connected to a source region of a third pass transistor PT3. The first to third pass transistors PT1, PT2, and PT3 may have different sizes from each other. For example, the first pass transistors PT1 may each have a first gate width A, and the second pass transistors PT2 may each have a second gate width B greater than the first gate width A. The third pass transistors PT3 may each have a third gate width C greater than the second gate width B.

A ground select line GSL may be connected to the first pass transistor PT1 having the first gate width A, and a string select line SSL may be connected to the third pass transistor PT3 having the third gate width C.

According to an embodiment illustrated in FIG. 13, an uppermost word line WL63 may be connected to a second pass transistor PT2, and a string select line SSL may be connected to a third pass transistor PT3. The second pass transistor PT2 may have a size greater than that of the third pass transistor PT3.

The second pass transistor PT2 may include first and second sub-transistors SPT1 and SPT2 that are connected in parallel between a row decoder (see 2 of FIG. 1) and the uppermost word line WL63, and the first and second sub-transistors SPT1 and SPT2 may have different sizes from each other. For example, the first and second sub-transistors SPT1 and SPT2 may have substantially the same gate length L, while the first sub-transistor SPT1 may have a first gate width A and the second sub-transistor SPT2 may have a second gate width B greater than the first gate width A.

The third pass transistor PT3 may include a plurality of sub-transistors SPT, and the plurality of sub-transistors SPT may be connected in parallel between a row decoder (see 2 of FIG. 1) and a string select line SSL. That is, the string select line SSL may be connected in common to source regions of the sub-transistors SPT. Each of the sub-transistors SPT constituting the third pass transistor PT3 may have substantially the same gate width A as that of the first pass transistor PT1.

Figure 14:
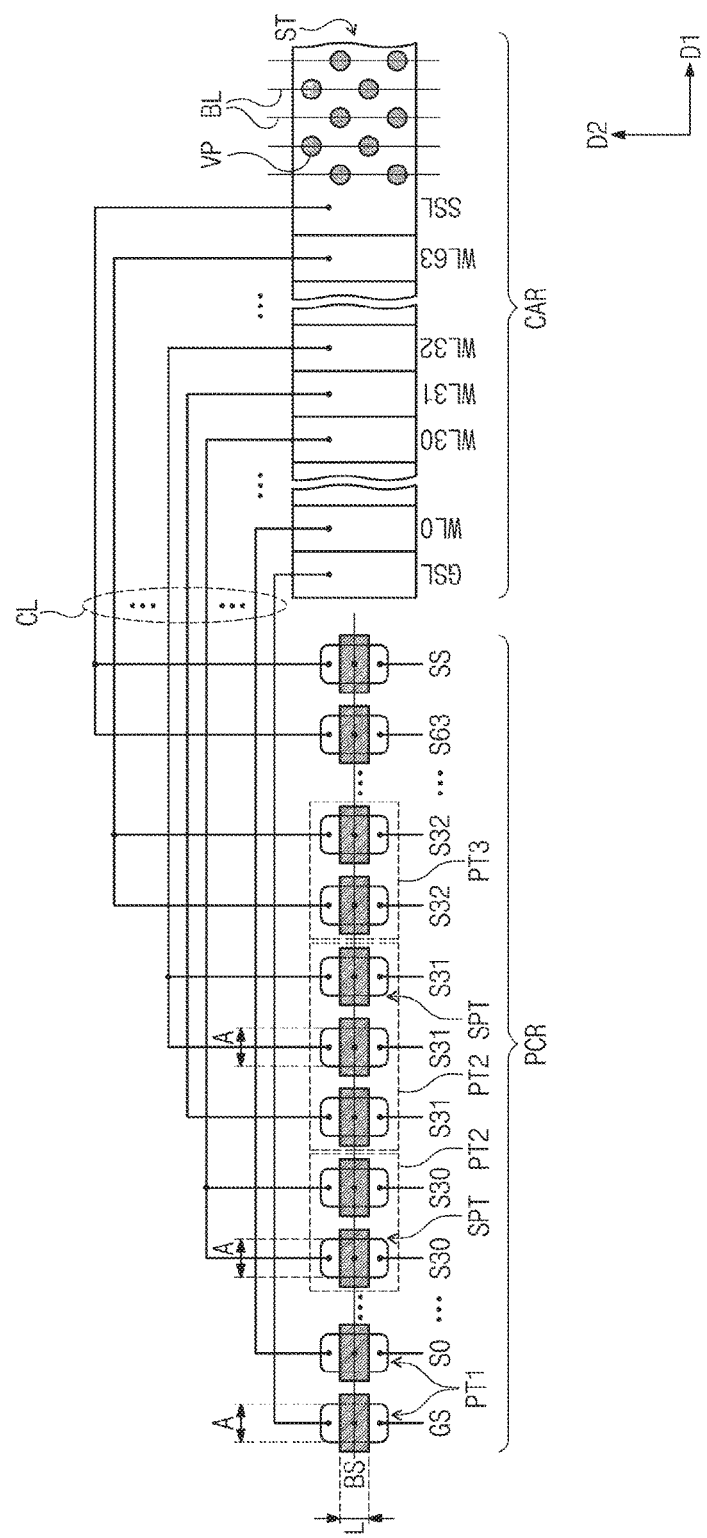
FIG. 14 is a simplified plan view of a three-dimensional semiconductor memory device according to exemplary embodiments of the present disclosure.
Figure 15:
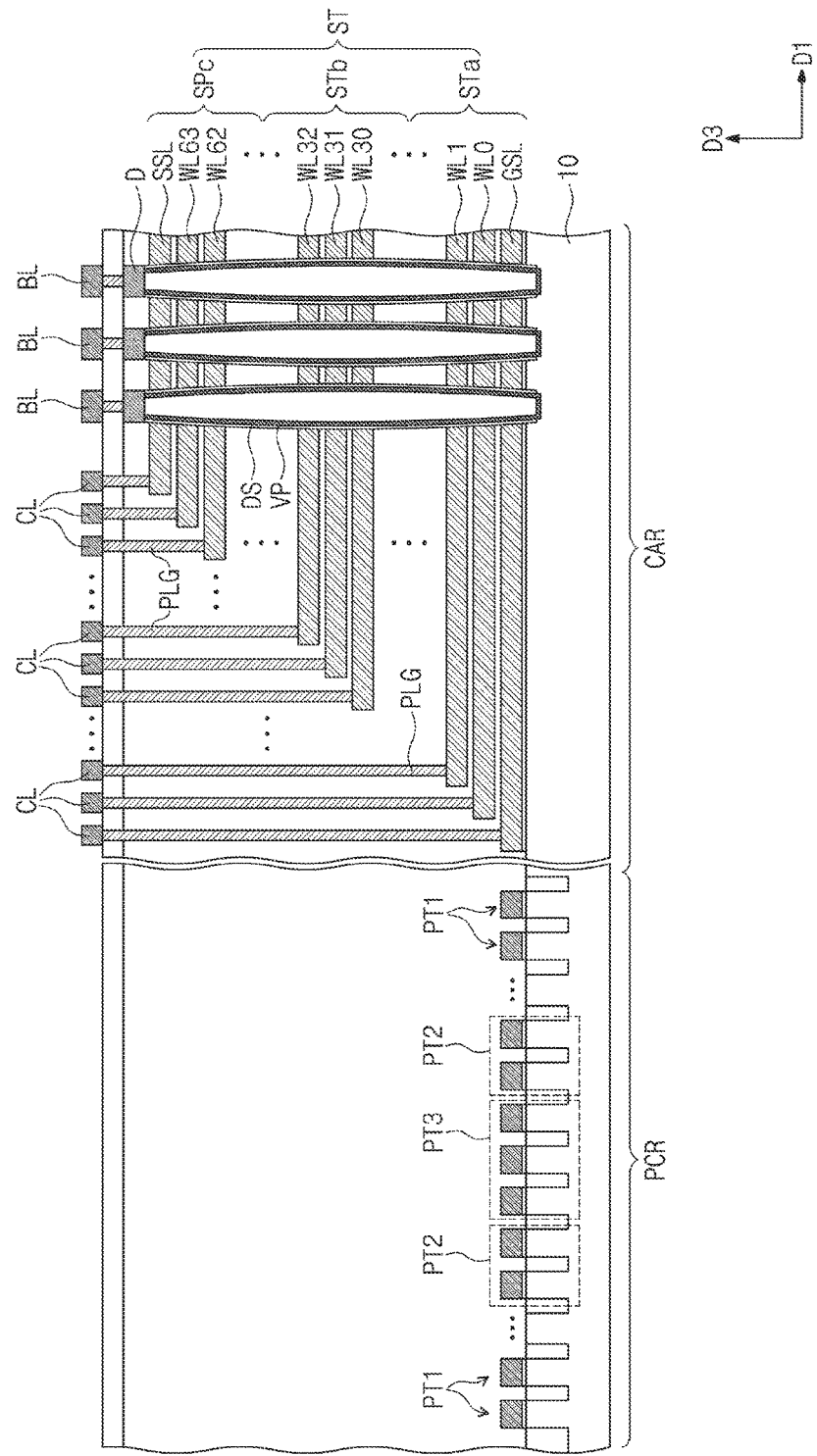
FIG. 15 is a simplified cross-sectional view taken along a first direction of FIG. 14 illustrating a three-dimensional semiconductor memory device according to exemplary embodiments of the present disclosure.

FIG. 14 is a simplified plan view of a three-dimensional semiconductor memory device according to exemplary embodiments of the present disclosure. FIG. 15 is a simplified cross-sectional view taken along a first direction of FIG. 14 illustrating a three-dimensional semiconductor memory device according to exemplary embodiments of the present disclosure. For brevity of the description, omission will be made in explaining technical features the same as those of the three-dimensional semiconductor device discussed above.

Referring to FIGS. 14 and 15, each of vertical semiconductor pillars VP on a substrate 10 of a cell array region CAR may have a maximum width at a middle portion STb of an electrode structure ST and a minimum width at lower and upper portions STa and STc of the electrode structure ST.

For example, a word line WL adjacent to the maximum width portion of the vertical semiconductor pillar VP may be electrically connected to a second pass transistor PT2 including a plurality of sub-transistors SPT. Lowermost word line WL0 may be electrically connected to a first pass transistor PT1. Uppermost word line WL63 may be electrically connected to a third pass transistor PT3.

FIG. 16 is a cross-sectional view of a three-dimensional semiconductor memory device according to exemplary embodiments of the present disclosure. FIGS. 17A to 17E are plan views illustrating pass transistors according to exemplary embodiments of the present disclosure. FIG. 18 is a table for explaining a connection between electrode structures and pass transistors according to exemplary embodiments of the present disclosure. For brevity of the description, omission will be made in explaining technical features the same as those of the three-dimensional semiconductor device discussed above.

Referring to FIG. 16, a substrate 10 of a cell array region CAR may be provided thereon with an electrode structure ST including ground and string select lines GSL and SSL and word lines WLa0, WLa1, ..., WLb0, WLb1, WLb2, ..., WLc0, and WLc1. The substrate 10 of a peripheral circuit region PCR may be provided thereon with a plurality of pass transistors PT1, PT2, and PT3 connected to the electrode structure ST.

As the stack number of the word lines WLa0 to WLc1 increases, a load may be increasingly imposed on word lines ..., WLc0, and WLc1 positioned at an upper portion of the electrode structure ST and also on contact plugs PLG and connection lines CL connected to the word lines ..., WLc0, and WLc1. Accordingly, the pass transistors PT1, PT2, and PT3 may have sizes that vary depending on the load imposed on the word lines WLa0 to WLc1 and the contact plugs PLG and the connection lines CL connected to the word lines WLa0 to WLc1. For example, the sizes of the pass transistors PT1, PT2, and PT3 may increase with increasing distances between a top surface of the substrate 10 and the word lines WLa0 to WLc1 of the electrode structure ST that are connected to the pass transistors PT1, PT2, and PT3. In addition, the sizes of the pass transistors PT1, PT2, and PT3 may also vary depending on a width of a vertical semiconductor pillar VP.

In some embodiments, the ground and string select lines GSL and SSL and the word lines WLa0 to WLc1 may each be connected to one of the first to third pass transistors PT1 to PT3. The first to third pass transistors PT1 to PT3 may have different sizes (e.g., different gate widths A, B, and C) from each other.

As one example, referring to FIGS. 16, 17A, 17B, and 17C, the first pass transistor PT1 may have a first gate G1 width A. The second pass transistor PT2 may have a second gate G2 width B greater than the first gate width A, and the third pass transistor PT3 may have a third gate G3 width C greater than the second gate width B.

Figure 17A:
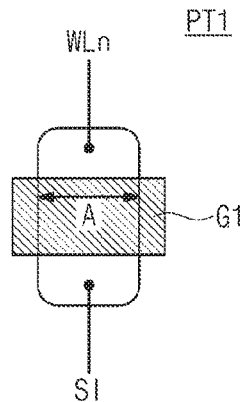
FIGS. 17A to 17E are plan views illustrating pass transistors according to exemplary embodiments of the present disclosure.
Figure 17B:
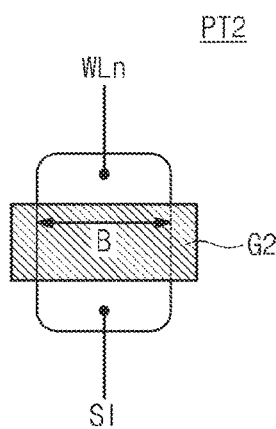
Figure 17C:
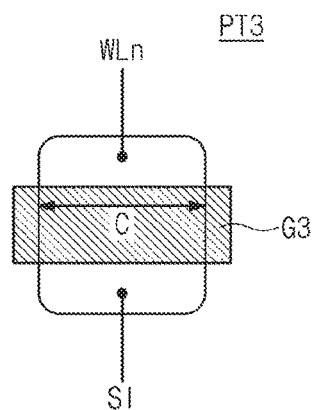
Figure 17D:
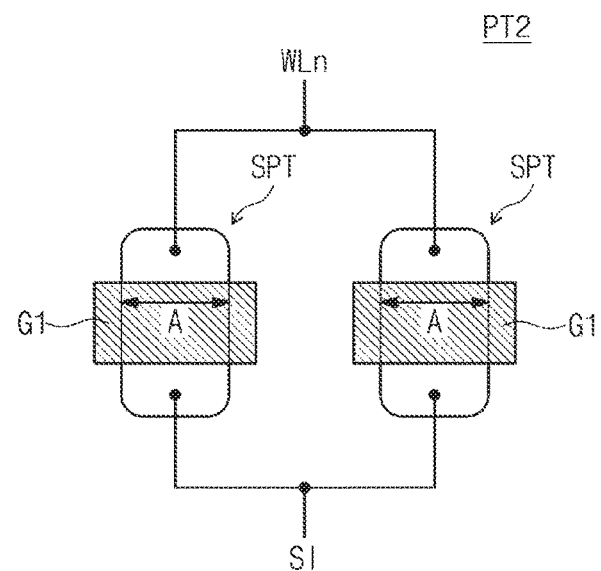

As another example, referring to FIG. 17D, the second pass transistor PT2 may include two sub-transistors SPT that are connected in parallel between a single word line WLn and a row decoder. In this example, each of the sub-transistors SPT may have substantially the same size as that of the first pass transistor PT1. In this configuration, the second pass transistor PT2 may have an effective gate width greater than a gate width of the first pass transistor PT1. Alternatively, the sub-transistors SPT constituting the second pass transistor PT2 may have different sizes from each other.

Figure 17E:
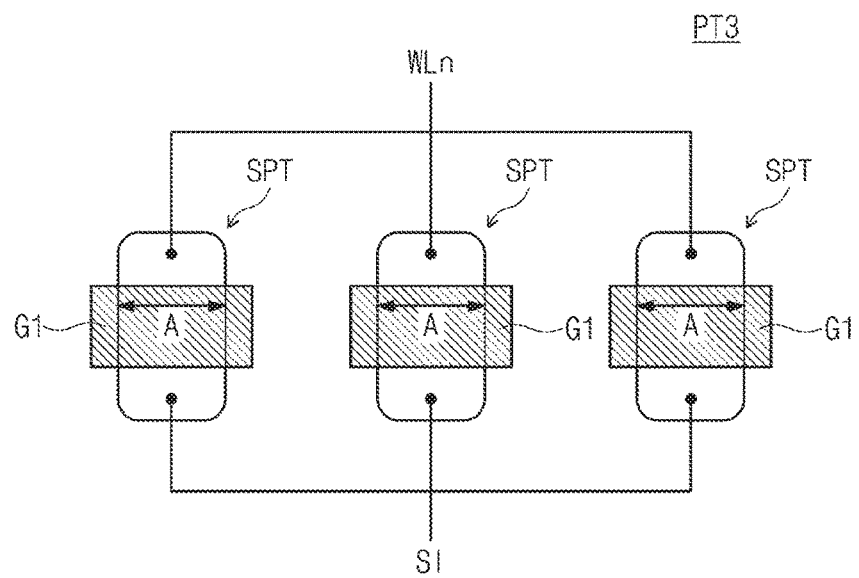

As other example, referring to FIG. 17E, the third pass transistor PT3 may include three sub-transistors SPT that are connected in parallel between a single word line WLn and a row decoder. In this example, each of the sub-transistors SPT may have substantially the same size as that of the first pass transistor PT1, and the third pass transistor PT3 may have an effective gate width greater than each of gate widths of the first and second pass transistors PT1 and PT2. Alternatively, the sub-transistors SPT constituting the third pass transistor PT3 may have different sizes from each other.

The embodiments of the present disclosure are not limited thereto, and sizes of the second and third pass transistors PT2 and PT3 may be variously changed depending on the stack number of the word lines WLa0 to WLc1 and the width of the vertical semiconductor pillar VP. FIG. 18 is referenced to explain in detail connections between the pass transistors PT1, PT2, and PT3 and the word lines WLa0 to WLc1 of the electrode structure ST.

According to first to third examples EX1 to EX3 shown in FIG. 18, the substrate of the peripheral circuit region may be provided thereon with a plurality of the first pass transistors PT1 and at least one second pass transistor PT2. In these examples, the second pass transistor PT2 may be found in FIG. 17B or 17D.

According to the first example, the uppermost word line WLc1 may be connected to the second pass transistor PT2, and other word lines WLa0 to WLc0 may each be connected to the first transistor PT1. In this configuration, the word line WLc1 connected to the second pass transistor PT2 may be positioned from a top surface of the substrate 10 at a first distance, and the word line WLc0 connected to the first pass transistor PT1 may be positioned from the top surface of the substrate 10 at a second distance less than the first distance.

According to the second example, the word line WLc0 connected to the second pass transistor PT2 may be positioned from the top surface of the substrate 10 at a first distance, and the word line WLc1 connected to the first pass transistor PT1 may be positioned from the top surface of the substrate 10 at a third distance greater than the first distance.

According to the third example, the word lines WLc0 and WLc1 positioned at an upper portion of the electrode structure ST may each be connected to the second pass transistor PT2.

According to fourth to sixth examples EX4 to EX6 shown in FIG. 18, the substrate of the peripheral circuit region may be provided thereon with the first pass transistors PT1, at least one second pass transistor PT2, and at least one third pass transistor PT3. In these examples, the second pass transistor PT2 may be found in FIG. 17B or 17D, and the third pass transistor PT3 may be found in FIG. 17C or 17E.

According to the fourth example, the top surface of the substrate 10 may be more distant from the word line WLc1 connected to the third pass transistor PT3 than from the word line WLc0 connected to the second pass transistor PT2. The top surface of the substrate 10 may also be less distant from the word lines WLa0 to WLb1 connected to the first pass transistors PT1 than from the word line WLc0 connected to the second pass transistor PT2.

According to the fifth example, the top surface of the substrate 10 may be less distant from the word line WLc0 connected to the third pass transistor PT3 than from the word line WLc1 connected to the second pass transistor PT2.

According to the sixth example, on a middle portion of the electrode structure ST, the word lines WLb0 and WLb1 may be connected respectively to the first and second pass transistors PT1 and PT2. On an upper portion of the electrode structure ST, the word lines WLc0 and WLc1 may each be connected to the third pass transistor PT3.

According to a seventh example EX7, the word lines WLa0 to WLb0 positioned at a lower portion of the electrode structure ST may each be connected to the first pass transistor PT1, and the word lines WLb1 to WLc1 positioned at an upper portion of the electrode structure ST may each be connected to the second pass transistor PT2.

According to an eighth example EX8, the word lines connected to the first pass transistors PT1 may be positioned from the top surface of the substrate at either a first distance or a third distance greater than the first distance, and the word lines connected to the second pass transistors PT2 may be positioned from the top surface of the substrate at either a second distance or a fourth distance. In this example, the second distance may be greater than the first distance and less than the third distance, and the fourth distance may be greater than the third distance.

According to the first to sixth examples EX1 to EX6, each of the ground and string select lines GSL and SSL may be connected to the first pass transistor PT1. According to the seventh example EX7, each of the ground and string select lines GSL and SSL may be connected to the second pass transistor PT2. According to the eighth example EX8, the ground select line GSL adjacent to the substrate 10 may be connected to the first pass transistor PT1, and the string select line SSL located at a topmost may be connected to the second pass transistor PT2.

Figure 19:
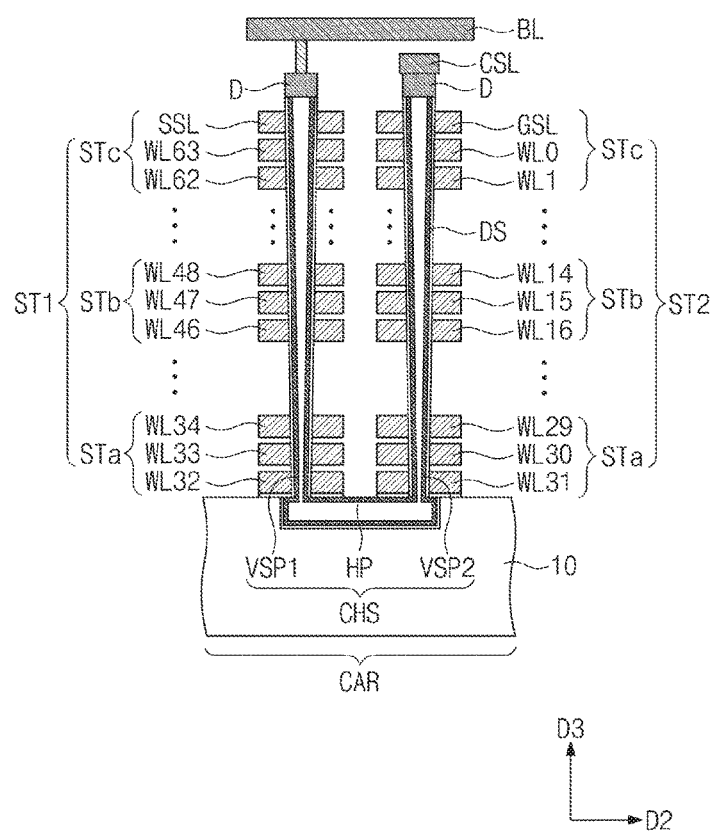
FIG. 19 is a cross-sectional view illustrating a cell array of a three-dimensional semiconductor memory device according to exemplary embodiments of the present disclosure.

FIG. 19 is a cross-sectional view illustrating a cell array of a three-dimensional semiconductor memory device according to exemplary embodiments of the present disclosure.

Referring to FIG. 19, a substrate 10 of a cell array region CAR may be provided thereon with first and second electrode structures ST1 and ST2 horizontally spaced apart from each other. The first electrode structure ST1 may include upper word lines WL32 to WL63 and a string select line SSL. The second electrode structure ST2 may include lower word lines WL0 to WL31 and a ground select line GSL.

A channel structure CHS may include a first vertical semiconductor pillar VSP1 penetrating the first electrode structure ST1, a second vertical semiconductor pillar VSP2 penetrating the second electrode structure ST2, and a horizontal semiconductor pattern HP connecting the first and second semiconductor pillars VSP1 and VSP2.

The first and second vertical semiconductor pillars VSP1 and VSP2 may be provided within vertical holes penetrating the first and second electrode structures ST1 and ST2. Each of the first and second semiconductor pillars VSP1 and VSP2 may have a conductive pad D at its top end. As discussed above, the first and second vertical semiconductor pillars VSP1 and VSP2 may each have a width (or a diameter) that increases as approaching its top. The first vertical semiconductor pillar VSP1 may be connected to one of bit lines BL, and the second vertical semiconductor pillar VSP2 may be connected to a common source line CSL.

The horizontal semiconductor pattern HP may be provided within a horizontal recession formed in the substrate 10. The horizontal semiconductor pattern HP may extend from beneath the first electrode structure ST1 toward beneath the second electrode structure ST2 to horizontally connect the first and second vertical semiconductor pillars VSP1 and VSP2. As discussed with reference to FIGS. 8 and 9, each of the first and second electrode structures ST1 and ST2 may include a lower portion STa, a middle portion STb, and an upper portion STc.

In some embodiments, one or more pass transistors may be connected to lower and upper word lines WL0 to WL63 of the first and second electrode structures ST1 and ST2.

For example, the first pass transistor PT1 shown in FIG. 17A may be connected to each of the word lines WL29 to WL31 and WL32 to WL34 positioned at the lower portions STa of the first and second electrode structures ST1 and ST2. The second pass transistor PT2 shown in FIG. 17B or 17D may be connected to each of the word lines WL14 to WL16 and WL46 to WL48 positioned at the middle portions STb of the first and second electrode structures ST1 and ST2. The third pass transistor PT3 shown in FIG. 17C or 17E may be connected to each of the string and ground select lines SSL and GSL and each of the word lines WL0, WL1, WL62, and WL63 positioned at the upper portions STc of the first and second electrode structures ST1 and ST2.

The present disclosure, however, is not limited thereto, and effective gate widths of the pass transistors may be variously changed.

Figure 20:
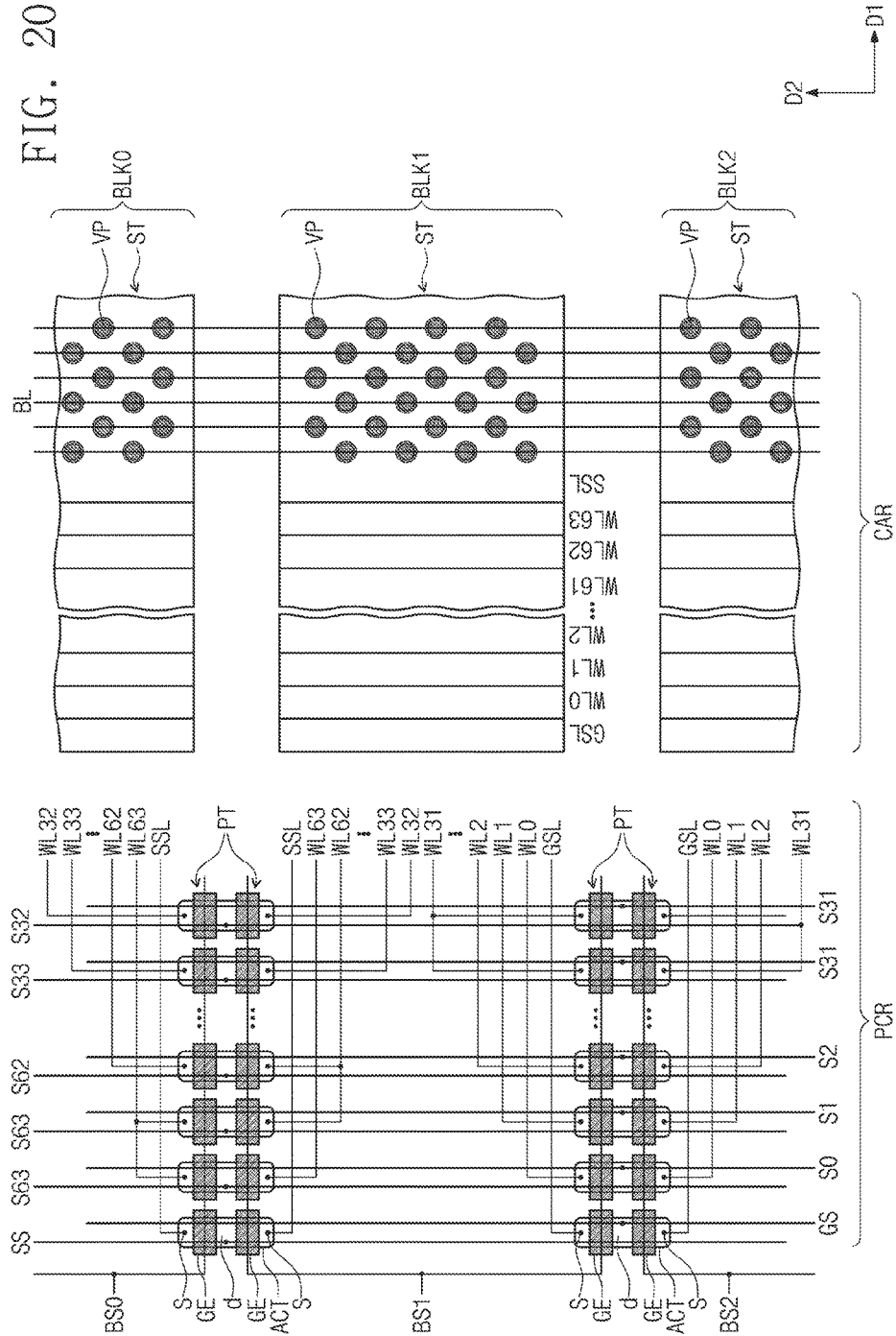
FIG. 20 is a simplified plan view of a three-dimensional semiconductor memory device according to exemplary embodiments of the present disclosure.

FIG. 20 is a simplified plan view of a three-dimensional semiconductor memory device according to exemplary embodiments of the present disclosure.

According to an embodiment illustrated in FIG. 20, a plurality of pass transistors PT connected to a single electrode structure ST may be arranged along first and second directions D1 and D2. In detail, a first pass transistor group may constitute a first row, and a second pass transistor group may constitute a second row. Each of the first and second pass transistor groups may include a plurality of the pass transistors PT arranged along the first direction D1.

In some embodiments, a plurality of active regions ACT may be arranged along the first and second directions D1 and D2 crossing each other. A pair of gate electrodes GE may be disposed on a single active region ACT, and a common drain region d may be provided between the pair of gate electrodes GE. The active regions ACT may each be provided therein with a source region s that is spaced apart from the common drain region d. The common drain regions d may each be coupled to a driving signal line GS, SS and S0 to S63, and the source regions s may be coupled to word lines WL0 to WL63 and select lines GSL and SSL of each of the electrode structures ST.

One of the pair of gate electrodes GE may constitute a pass transistor PT connected to a first memory block BLK1, and the other of the pair of gate electrodes GE may constitute a pass transistor PT connected to a second memory block BLK0 or BLK2. The pass transistors PT connected to the memory block BLK0 may be controlled by the block select signal BS0 provided from the row decoder 2, the pass transistors PT connected to the memory block BLK1 may be controlled by the block select signal BS1 provided from the row decoder 2, and the pass transistors PT connected to the memory block BLK2 may be controlled by the block select signal BS2 provided from the row decoder 2.

Each of the first and second pass transistor groups may include first pass transistors and second pass transistors. As discussed above, the second pass transistor may include a plurality of sub-transistors connected in parallel between a row decoder and one (e.g., WL63) of the word lines.

According to exemplary embodiments of the present disclosure, in an electrode structure including vertically stacked word lines, it may be possible to reduce a time difference in transmitting driving signals from pass transistors to lower and upper word lines. Accordingly, the three-dimensional semiconductor memory device may have enhanced reliability and electrical characteristics.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

Although the present disclosure has been described in connection with the embodiments of the present disclosure illustrated in the accompanying drawings, it will be understood to those skilled in the art that various changes and modifications may be made without departing from the technical spirit and essential feature of the present disclosure. It will be apparent to those skilled in the art that various substitution, modifications, and changes may be thereto without departing from the scope and spirit of the disclosure.

What is claimed is:

1. A three-dimensional semiconductor memory device comprising:
   a cell string vertically extending from a top surface of a substrate and including first and second cell transistors;
   first and second word lines connected to gate electrodes of the first and second cell transistors, respectively;
   a first pass transistor connecting the first word line to a row decoder; and
   a second pass transistor connecting the second word line to the row decoder, wherein
   the first pass transistor comprises a plurality of first sub-transistors connected in parallel between the first word line and the row decoder.

2. The three-dimensional semiconductor memory device of claim 1, wherein the first sub-transistors each have the same size as that of the second pass transistor.

3. The three-dimensional semiconductor memory device of claim 1, wherein the first sub-transistors have the same gate length and the same gate width.

4. The three-dimensional semiconductor memory device of claim 1, wherein the first sub-transistors have the same gate length and different gate widths.

5. The three-dimensional semiconductor memory device of claim 1, wherein:
   the first word line is positioned from the top surface of the substrate at a first distance, and
   the second word line is positioned from the top surface of the substrate at a second distance less than the first distance.

6. The three-dimensional semiconductor memory device of claim 1, wherein the cell string comprises:
   an electrode structure including a plurality of word lines vertically stacked on the substrate, the plurality of word lines including the first and second word lines;
   a vertical semiconductor pillar having a width that increases as approaching its top from its bottom and penetrating the electrode structure; and
   a data storage layer between the electrode structure and the vertical semiconductor pillar.

7. The three-dimensional semiconductor memory device of claim 1, wherein the cell string comprises:
   a lower electrode structure including a plurality of lower electrodes vertically stacked on the substrate;
   a lower semiconductor pillar penetrating the lower electrode structure;
   an upper electrode structure including a plurality of upper electrodes vertically stacked on the lower electrode structure; and
   an upper semiconductor pillar penetrating the upper electrode structure and connected to the lower semiconductor pillar, wherein each of the lower and upper semiconductor pillars has a width that increases as approaching its top from its bottom, and each of the lower and upper electrode structures comprises the first and second word lines.

8. The three-dimensional semiconductor memory device of claim 1, further comprising:
a third cell transistor connected in series to the second cell transistor;
a third word line connected to a gate electrode of the third cell transistor; and
a third pass transistor connecting the third word line to the row decoder, wherein:
the first to third word lines are sequentially stacked on the substrate, and
the third pass transistor has a size greater than that of the first pass transistor.

9. The three-dimensional semiconductor memory device of claim 8, wherein:
the third pass transistor comprises a plurality of second sub-transistors connected in parallel between the third word line and the row decoder, and
a number of the second sub-transistors constituting the third pass transistor being different from that of the first sub-transistors constituting the first pass transistor.

10. A three-dimensional semiconductor memory device comprising:
a substrate including a peripheral circuit region and a cell array region;
an electrode structure including word lines vertically stacked on the substrate of the cell array region, the word lines including a lower word line positioned from a top surface of the substrate at a first distance and an upper word line positioned from the top surface of the substrate at a second distance greater than the first distance;
a first pass transistor disposed on the substrate of the peripheral circuit region and connecting a row decoder to the lower word line; and
a second pass transistor disposed on the substrate of the peripheral circuit region and connecting the row decoder to the upper word line, wherein
the first pass transistor comprises m first sub-transistors connected to the lower word line, and the second pass transistor comprises n second sub-transistors connected to the upper word line, wherein n and m are natural numbers.

11. The three-dimensional semiconductor memory device of claim 10, further comprising:
a vertical semiconductor pillar penetrating the electrode structure; and
a data storage layer between the electrode structure and the vertical semiconductor pillar, wherein
the vertical semiconductor pillar has a width that increases as approaching its top from its bottom.

12. The three-dimensional semiconductor memory device of claim 10, wherein:
the first sub-transistors are connected to each other in parallel between the row decoder and the lower word line, and
the second sub-transistors are connected to each other in parallel between the row decoder and the upper word line.

13. The three-dimensional semiconductor memory device of claim 10, wherein the first and second sub-transistors have the same gate length and the same gate width.

14. The three-dimensional semiconductor memory device of claim 13, wherein n and m are different natural numbers from each other.

15. The three-dimensional semiconductor memory device of claim 13, wherein the first pass transistor has an effective gate width different from that of the second pass transistor.

* * * * *